US008759127B2

(12) United States Patent
Hu

(10) Patent No.: US 8,759,127 B2
(45) Date of Patent: Jun. 24, 2014

(54) GOLD MICROMASK FOR ROUGHENING TO PROMOTE LIGHT EXTRACTION IN AN LED

(75) Inventor: Syn-Yem Hu, San Jose, CA (US)

(73) Assignee: Toshiba Techno Center Inc., Tokyo (JP)

( * ) Notice: Subject to any disclaimer, the term of this patent is extended or adjusted under 35 U.S.C. 154(b) by 0 days.

(21) Appl. No.: 13/359,428

(22) Filed: Jan. 26, 2012

(65) Prior Publication Data

US 2013/0049006 A1    Feb. 28, 2013

Related U.S. Application Data

(60) Provisional application No. 61/529,868, filed on Aug. 31, 2011.

(51) Int. Cl.
*H01L 33/22* (2010.01)
*H01L 21/3065* (2006.01)

(52) U.S. Cl.
CPC .................................. *H01L 33/22* (2013.01)
USPC ............................................. 438/29; 257/76

(58) Field of Classification Search
CPC .............. H01L 33/22; H01L 21/02642; H01L 21/30612; H01L 21/3065
USPC ............................................................ 438/29
See application file for complete search history.

(56) References Cited

U.S. PATENT DOCUMENTS

| 7,202,510 | B2 * | 4/2007 | Tada et al. .................. 257/102 |
| 2006/0151428 | A1 | 7/2006 | Windisch et al. ................ 216/41 |
| 2007/0145557 | A1 | 6/2007 | Kamiyama et al. ............ 257/678 |
| 2008/0224157 | A1 * | 9/2008 | Slater .............................. 257/98 |
| 2009/0045434 | A1 | 2/2009 | Muraki et al. ................. 257/103 |
| 2009/0065938 | A1 * | 3/2009 | Takano et al. ................. 257/750 |
| 2009/0152565 | A1 * | 6/2009 | Brandes et al. ................. 257/76 |
| 2009/0309119 | A1 * | 12/2009 | Shinohara et al. .............. 257/99 |
| 2010/0041170 | A1 * | 2/2010 | Epler et al. ..................... 438/26 |
| 2011/0129948 | A1 * | 6/2011 | Hsieh et al. .................... 438/16 |

FOREIGN PATENT DOCUMENTS

| JP | 2007-123450 | 10/2005 |
| JP | 2008-159894 | 12/2006 |
| KR | 1020110050212 | 11/2009 |

OTHER PUBLICATIONS

Williams et al., Etch Rates for Micromachining Processing—Part II, 2003, Journal of Microelectromechanical Systems, vol. 12, No. 6, pp. 761-778.*

(Continued)

*Primary Examiner* — Julia Slutsker
*Assistant Examiner* — Natalia Gondarenko
(74) *Attorney, Agent, or Firm* — Hogan Lovells US LLP

(57) ABSTRACT

Gold is used as a micromask to roughen a gallium nitride (GaN) surface in an LED device. In one example, a mesh of ITO (Indium Tin Oxide) is formed on a GaN layer. The mesh has holes that extend down to the GaN. A layer of silicon dioxide is deposited so that it covers the GaN at the bottoms of the holes. A layer of gold is formed over the oxide. A thermal treatment causes the gold to ball up into small gold features. These gold features are used as a micromask in a subsequent etching step. Areas of the bottoms of the holes that are not covered by a gold feature are etched. Etching occurs through the oxide and down into the GaN. The roughening process involves no silver, and involves no harsh cleaning solvents or processes that might otherwise have been used were the micromask made of silver.

19 Claims, 12 Drawing Sheets

TOP-DOWN VIEW OF LATERAL LED DEVICE

TRENCH

(56) References Cited

OTHER PUBLICATIONS

Liu et al., Aluminum-photoresist Dual-layer Lift-off Process for Gold Micropattern Preparation in Cellular Researches, 2010, Proceedings of the 2010 5th IEEE International Conference on Nano/Micro Engineered and Molecular Systems Jan. 20-23, Xiamen, China, pp. 297-300.*

Lai et al., GaN-Based LEDs With Mesh ITO p-Contact and Nanopillars, 2009, IEEE Photonics Technology Letters, Vol. 21, No. 18, September 15, pp. 1293-1295.*

International Search Report and Written Opinion by the Korean Intellectual Property Office (KIPO) as international searching authority (ISA) in the related international application PCT/US2012/052762 dated Jan. 31, 2013 (13 pages).

Mike Cooke, "Self-organized process for light boost," Semiconductor Today, Mar. 7, 2011, downloaded from www.semiconductor-today.com/news.../CHHAJED_0703110.html (3 pages).

Justin Hwa, "Aligned Growth of ZnO Nanorods," downloaded on Aug. 26, 2011, from www.mtixtl.com/xtlflyers/vlspapers/JustinHwaReport.pdf (7 pages).

Lai et al., "GaN-Based LEDs with Mesh ITO p-Contact and Nanopillars," IEEE Photonics Technology Letters, vol. 21, No. 18, Sep. 15, 2009 (3 pages).

Song et al., "Disordered antireflective nanostructures on GaN-based light-emitting diodes using Ag nanoparticles for improved light extraction efficiency," Applied Physics Letters 97 093110 (Jul. 10, 2010) (3 pages).

* cited by examiner

TOP-DOWN VIEW OF
LATERAL LED DEVICE

CROSS-SECTIONAL VIEW TAKEN ALONG LINE A-A

MESHED ITO

ROUGHENED EDGE AT
MESA OF N-TRENCH

ROUGHENED EDGE AT
MESA OF N-TRENCH

ROUGHENED GaN IN ONE
HOLE OF THE ITO MESH

ROUGHEN MESA EDGE

ITO DEPOSITION

ITO PATTERN (FORM HOLES IN ITO)

OXIDE DEPOSITION

GOLD DEPOSITION

GOLD BALLS UP TO FORM A
MICROMASK LAYER

ETCH INTO GaN USING
GOLD AS A MICROMASK

REMOVE GOLD
MICROMASK LAYER

ANNEAL ITO-TO-p-GaN CONTACT

ADD METAL ELECTRODES

FORM PASSIVATION LAYER OVER
THE ROUGHENED SURFACE

CROSS-SECTION OF
ROUGHENED p-GaN

PERSPECTIVE VIEW OF
ROUGHENED p-GaN

| STEP NAME | NEW PROCESS CONDITIONS AND MATERIALS | PREVIOUSLY USED |
|---|---|---|
| n-TRENCH FORMATION | ICP/RIE DRY ETCH WITH ($BCl_3$/$Cl_2$) FOR ABOUT 1.5 MICRONS | |
| ITO DEPOSITION | E-BEAM 1000 ANGSTROMS | |
| ITO PATTERN | FORM HOLES WITH DIAMETER OF 8-16 MICRONS | |
| ITO MESH ETCH | TE-100 WET ETCH AT 50°C FOR 4 MIN | |
| PHOTORESIST STRIP | SOLVENT | |
| OXIDE DEPOSITION | 150 ANGSTROMS USING PECVD OR E-BEAM | |
| GOLD DEPOSITION | 100 ANGSTROMS USING E-BEAM (THICKER LAYER RESULTS IN BIGGER GOLD BALLS) | SILVER |
| THERMAL TREATMENT | 300°C IN $N_2$ FOR 5 MINUTES WITH NO OXYGEN (HIGHER TEMPERATURE RESULTS IN BIGGER GOLD BALLS) | |
| GOLD BALLS-UP TO FORM A MASK LAYER | | BALLED UP SILVER |
| ETCH INTO GaN USING GOLD AS MICROMASK | ICP/RIE ETCHING WITH $BCL_3$/$CL_2$ 0.4 MICRONS AVERAGE PITCH (AVE DISTANCE PER PIT) | USE SILVER AS A MICROMASK |
| REMOVE GOLD MICROMASK LAYER FROM DEVICE WAFER | TRANSENE AU ETCHANT GE-8148 (<20 SECONDS) TO CLEAN UP GOLD RESIDUE ON WAFER SURFACE (<5% OF $SiO_2$ REMAINS) | CLEAN SILVER CHLORIDE FROM DEVICE WAFER USING A HARSH SOLVENT SUCH AS $H_2SO_4$ |
| CLEAN GOLD FROM REACTION CHAMBER | FIRST CLEAN GOLD FROM REACTION CHAMBER WALL USING $SF_6$/$O_2$ PLASMA, THEN PERIODICALLY PHYSICALLY WIPE REACTION CHAMBER WITH ALCOHOL | CLEAN SILVER CHLORIDE FROM DEVICE USING PLASMA $SF_6$/$O_2$, BUT NOT AS EFFECTIVE ON SILVER CHORIDE AS ON GOLD |
| REMOVE ITO FROM n-TRENCH | TE-100 WET ETCH OVER PHOTORESIST STRIP FOR 15 MIN AT 50°C | |
| ANNEAL ITO TO p-GaN CONTACT | 300°C FOR 5 MIN IN 80% N AND 20% $O_2$; 550°C FOR 5 MIN IN $N_2$ | |
| ADD METAL ELECTRODES | Cr/Al/Ti/Pt/Au at 5A/5000A/1000A/1000A/3.5MICRONS | |
| PASSIVATION | HIGH-PRESSURE AND LOW DEPOSITION RATE<br><br>1000mT<br><br>33 ANGSTROMS/MIN | LOW-PRESSURE AND HIGH DEPOSITION RATE<br><br>600mT<br><br>157 ANGSTROMS/MIN |

FIG. 22

GOLD MICROMASK FOR ROUGHENING TO PROMOTE LIGHT EXTRACTION IN AN LED

TECHNICAL FIELD

The present disclosure relates generally to roughening surfaces of a Light Emitting Diode (LED) device to promote light extraction and related methods and structures.

BACKGROUND INFORMATION

Of the light generated by an LED device, only the light that escapes the device is usable for illumination purposes. To increase the amount of light that escapes the device, and correspondingly to decrease the amount of light that is reflected back into the device and absorbed, certain surfaces of the LED device may be roughened. For example, in a commercial laterally-contacted LED device the p-type gallium nitride (p-GaN) layer on the top of the LED device is sometimes grown such that its upper surface is rough. Due to this roughening, more of the light generated within the active layer of the LED device will pass through the upper surface of the p-GaN layer and escape the device. There are also other ways of increasing the amount of light that escapes an LED device. For example, the epitaxial gallium-nitride layers of an LED device are grown on a substrate. Rather than this substrate having a smooth upper surface, the upper surface upon which the epitaxial layers are grown can be roughened. The resulting roughness of the substrate-to-epi interface at the bottom of the LED device promotes light extraction. Although these methods of increasing light extraction function quite well, they also have certain drawbacks in certain circumstances. For example, an LED whose p-GaN layer is grown to be rough may exhibit an undesirably high forward voltage and may suffer from reliability problems under high voltage conditions. Manufacturing costs associated with an LED whose epitaxial layers are grown on a roughened sapphire substrate may be undesirably high due to the expense of obtaining machine-roughened wafers.

SUMMARY

Gold is used as a micromask on top of a silicon dioxide layer to etch down through the silicon dioxide and to etch into a gallium nitride layer, thereby roughening the gallium nitride layer. In one specific example, a layer of Indium Tin Oxide (ITO) is deposited on a p-GaN layer of an LED device being formed. Holes are formed in the ITO layer so that the ITO layer forms an ITO mesh layer. Each hole extends through the ITO layer and exposes a circular area of an upper surface of the underlying p-GaN layer. A layer of silicon dioxide is then formed over the structure such that silicon dioxide covers the circular areas at the bottoms of the holes in the ITO mesh. A layer of gold is then deposited on the layer of silicon dioxide. A thermal treatment step results in gold from the gold layer thermally segregating into small portions and balling up to form a plurality of small gold features. These small gold features are substantially evenly distributed across the silicon dioxide layer, including across the circular areas at the bottoms of the holes. These gold features are together referred to as a gold micromask.

Next, an etching step is performed using the gold micromask as an etching mask. Areas at the bottoms of the holes that are not covered by a gold feature are etched. Etching removes the silicon dioxide in these areas. Etching proceeds into the surface of the underlying p-GaN layer. The individual pits etched into the upper surface of the p-GaN layer in this way may have a pitch of approximately 0.4 microns, and an average depth of about one hundred nanometers. The result of these pits being etched into the p-GaN surface is roughening of the p-GaN surface. This roughening is performed to facilitate light escaping from the LED device.

After the etching step, gold of the gold micromask is removed. Rather than harsh cleaning solvents being used as might be necessary were the small micromask features are made of silver, a relatively gentle cleaning solvent and gentle cleaning process is used. After the surface roughening step has been performed, the remainder of the LED fabrication process is carried out. In this way, an ITO mesh structure is formed over a p-GaN layer of an LED, where the upper surface of the p-GaN at the bottoms of the holes is rough.

Although the roughening process is described above in connection with the circular bottom portions of holes in a ITO mesh being roughened, the roughening process is of general utility and may be used to roughen other surfaces of the LED. In another specific example, the gold micromask is made to extend over a sidewall of a mesa of the LED device. The micromask is then used to roughen the sidewall.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 22 is a table that sets forth steps in the method of manufacture of FIGS. 8-19.

DETAILED DESCRIPTION

Reference will now be made in detail to some embodiments of the invention, examples of which are illustrated in the accompanying drawings. In the description and claims below, when a first layer is referred to as being disposed "over" a second layer, it is to be understood that the first layer can be directly on the second layer, or an intervening layer or layers may be present between the first and second layers. The terms such as "over", "under", "upper", "lower", "top", "bottom", "upward", "downward", "vertically", and "laterally" are used herein to describe relative orientations between different parts of the blue LED device being described, and it is to be understood that the overall blue LED device being described can actually be oriented in any way in three-dimensional space.

Figure 1:
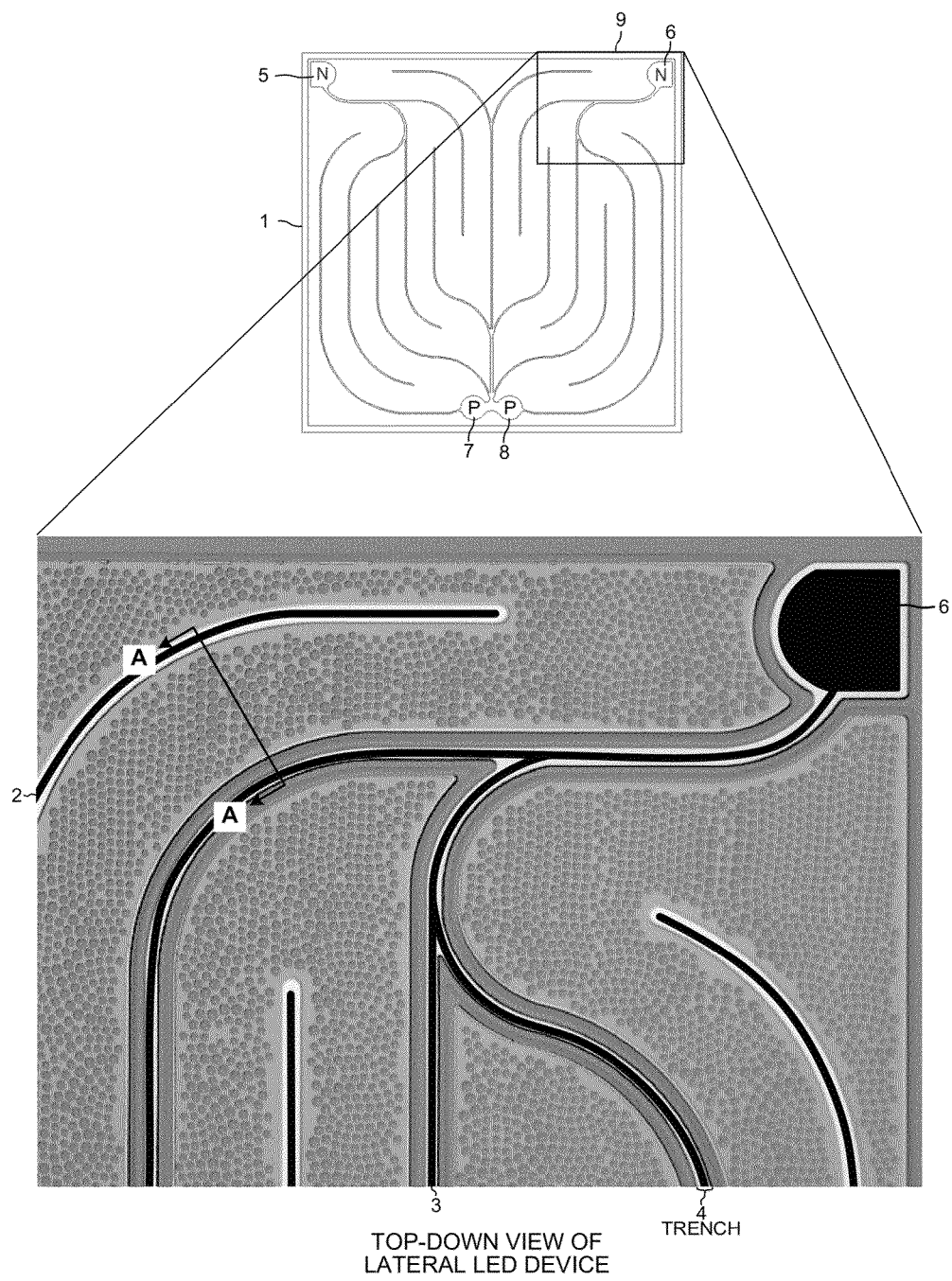
FIG. 1 is a top-down view of a lateral LED device in accordance with one novel aspect.

FIG. 1 is a top-down view of a lateral LED device 1. A lateral LED device is also sometimes referred to as a laterally-contacted LED device to distinguish it from a vertical or vertically-contacted LED device. Lateral LED device 1 has a P-electrode 2 and an N-electrode 3. These electrodes are made of metal. N-electrode 3 is disposed in the bottom of a trench 4 that is etched into the epitaxial stack of the LED device. This trench 4 is referred to as an "N-trench". Trench 4 forms what are referred to as "mesas". The mesas have mesa sidewalls. The P-electrode 2, on the other hand, is not disposed in a trench. Electrical contact to electrodes 2 and 3 is made at bond pads 5-8. The rectangular portion 9 is shown in expanded view at the bottom of FIG. 1. Regions of a mesh layer of indium tin oxide (ITO) are seen covering most portions of the upper surface of the LED device, except for the bottoms of the N-trenches and the bond pads. Each such region of the mesh layer of ITO has a number of circular holes. The P-electrode 2 on the top of the LED device structure makes electrical contact with an underlying region of the ITO mesh layer such that most of the upper surface of the LED device can be thought of as being covered by the p-type electrode.

Figure 2:
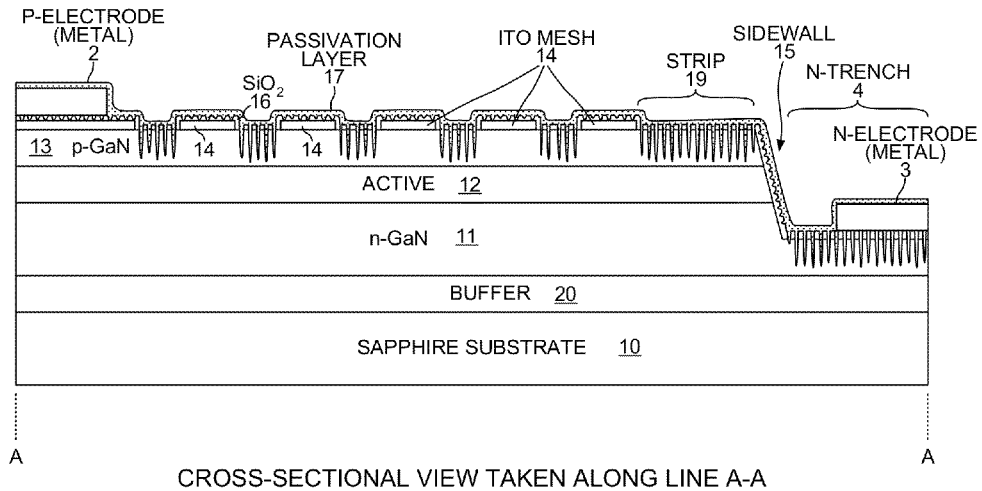
FIG. 2 is a cross-sectional diagram taken along sectional line A-A of FIG. 1.

FIG. 2 is a simplified cross-sectional diagram taken along sectional line A-A in the diagram of FIG. 1. A buffer layer 20 is disposed on a sapphire substrate 10. An n-type gallium nitride (n-GaN) layer 11 is disposed over the buffer layer 20, an active layer 12 is disposed over the n-GaN layer 11, and a p-GaN layer 13 is disposed over the active layer 12. Other intervening layers of the multi-layer epitaxial structure are not shown in the simplified illustration of FIG. 2. Reference numeral 14 identifies the ITO mesh layer that is pictured in cross-section. The illustrated portions of ITO mesh layer 14 are not individual separate portions of ITO, but rather are sectional views of one region of the ITO mesh layer. Reference numeral 15 identifies the sidewall of the mesa formed by the N-trench 4. Reference numeral 16 identifies portions of an insulating layer of silicon dioxide. Metal N-electrode 3 is disposed at the bottom of the N-trench 4 at the right of the diagram, whereas metal P-electrode 2 is disposed at the left of the diagram on top of the silicon dioxide layer. The P-type electrode makes electrical contact to the ITO mesh layer 14 beneath it through the many small holes that extend through the silicon dioxide layer 16. Metal of the P-electrode 2 extends down into these holes in the silicon dioxide and makes contact with the top of the ITO layer. Similarly, the N-type electrode 3 at the right of the diagram makes electrical contact to the underlying n-GaN layer 11 through the many holes in the silicon dioxide layer. A passivation layer 17 covers the entire structure of the cross-sectional view of FIG. 2. Although the passivation layer 17 covers the entire portion of the structure illustrated in the cross-section of FIG. 2, there are openings in the passivation layer 17 over the bond pads 5-7 (see FIG. 1).

Figure 3:
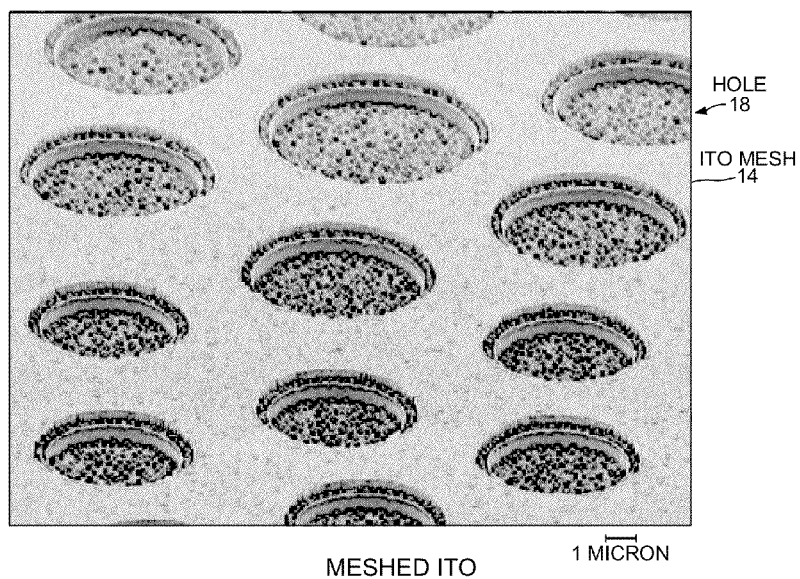
FIG. 3 is a perspective scanning electron microscope photograph of a portion of the ITO mesh layer of FIG. 2.

FIG. 3 is a perspective scanning electron microscope photograph of a portion of the ITO mesh layer 14. The ITO mesh layer 14 forms numerous holes. The holes are of different diameters. Reference numeral 18 identifies one of these holes. The roughened circular surfaces at the bottoms of the holes are roughened portions of the upper surface of p-GaN layer 13.

Figure 4:
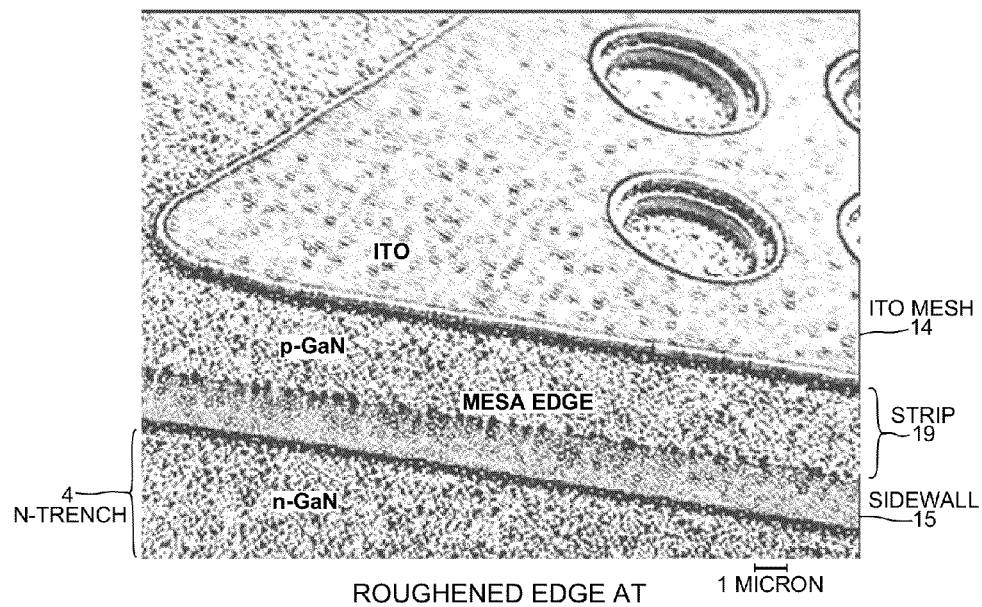
FIG. 4 is a perspective scanning electron microscope photograph of a mesa sidewall of the LED device of FIG. 1.

FIG. 4 is a perspective scanning electron microscope photograph of the mesa sidewall edge of a portion of the LED device of FIG. 1. The ITO mesh layer 14 does not extend to the edge of the sidewall 15, but rather there is an exposed strip 19 of p-GaN that extends along the rim of the mesa. This strip portion 19 of p-GaN is roughened, as is the sidewall 15 of the mesa, as is the n-GaN bottom of the N-trench 4.

Figure 5:
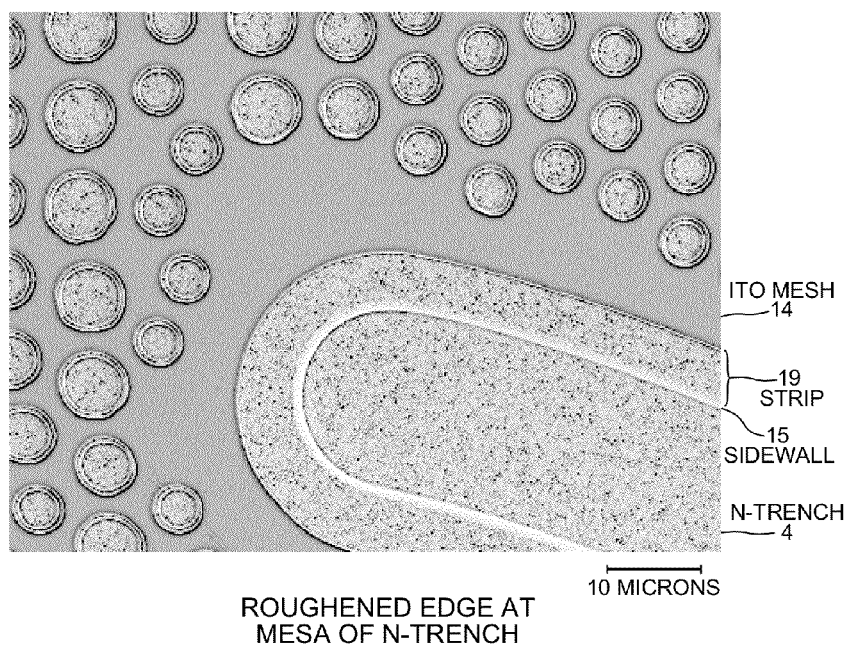
FIG. 5 is a top-down scanning electron microscope photograph of a portion of the N-trench of the LED device of FIG. 1.

FIG. 5 is a top-down scanning electron microscope photograph of a portion of the LED device of FIG. 1 before metallization. Reference numeral 15 identifies the sidewall of the mesa. Reference numeral 4 identifies the N-trench. Although the entire bottom of the N-trench 4 is roughened in this example, in another example a portion of the N-trench 4 upon which the metal N-electrode 3 will be disposed is not roughened.

Figure 6:
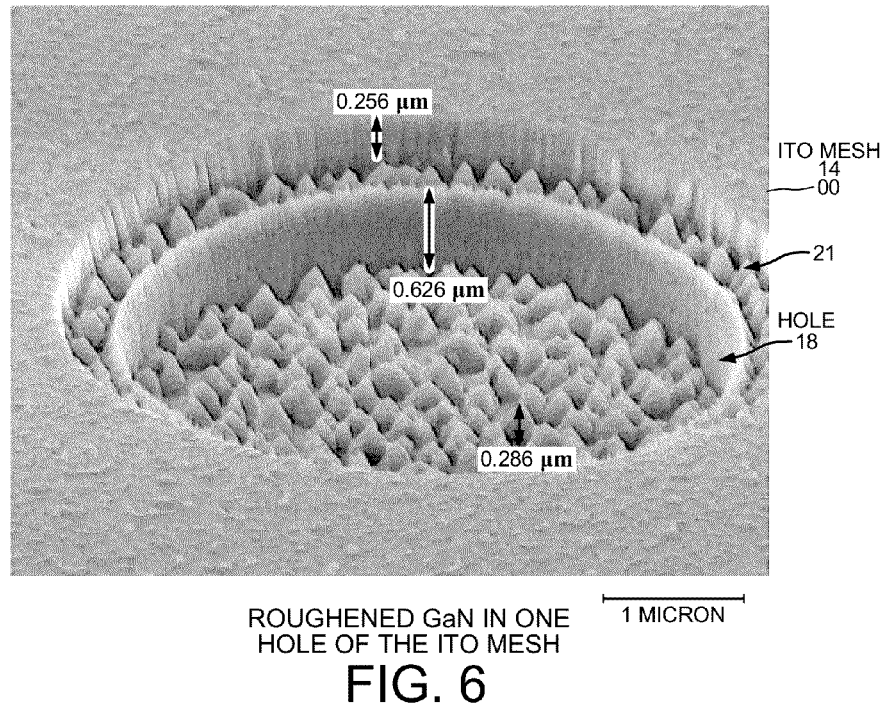
FIG. 6 is a perspective scanning electron microscope photograph of one of the holes in the ITO mesh of the LED device of FIG. 1.

FIG. 6 is a perspective scanning electron microscope photograph of hole 18. The bottom of the hole 18 has a rough surface. The peripheral ring 21 is believed to be an artifact due to incomplete etching of the ITO in a prior step of etching the holes in the ITO layer. As a consequence of leaving some ITO in the peripheral area around the bottom of hole 18, the subsequent etching that forms the roughening occurs in a different fashion in this peripheral ring area as compared to the etching that occurs at the bottom of the hole 18 where there is no residual ITO present.

Figure 7:
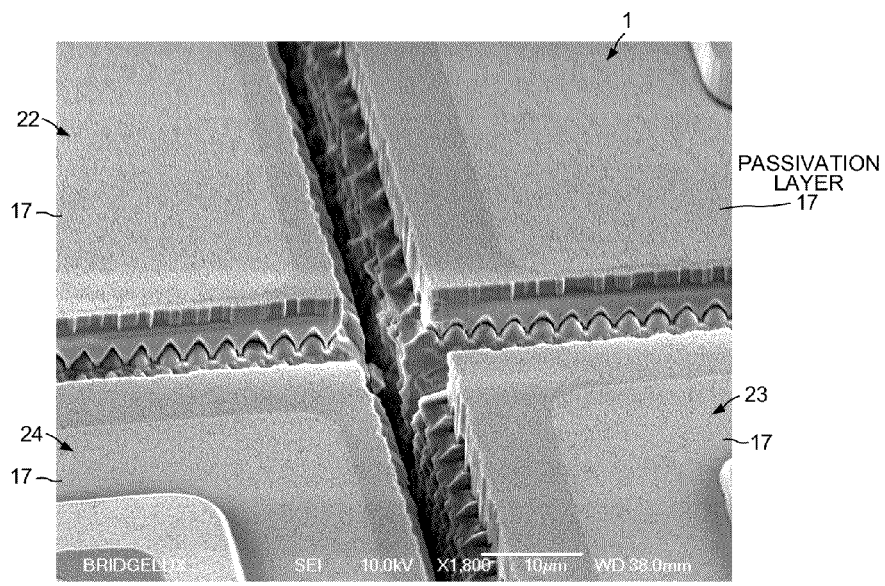
FIG. 7 is a perspective scanning electron microscope photograph of four LED devices of a single device wafer prior to singulation.

FIG. 7 is a perspective scanning electron microscope photograph of four LED devices 1, 22, 23 and 24 of a single device wafer. The photograph is taken before metal electrodes are formed, and before dicing of the device wafer into individual LED devices. Reference numeral 17 identifies the passivation layer. The passivation layer does not extend all the way to the edge of the square LED devices.

Figure 8:
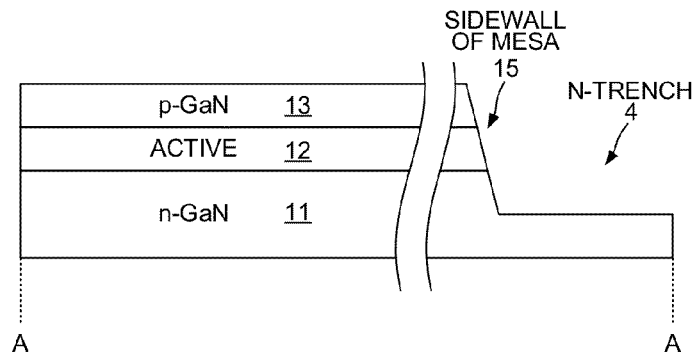
FIG. 8 is a diagram of a step of forming the N-trench of the LED device of FIG. 1.

FIGS. 8-19 are simplified diagrams that set forth a method of manufacturing an LED device in accordance with one novel aspect. FIG. 8 shows a step of formed the N-trench 4. N-trench 4 may be formed by inductively coupled plasma (ICP)/reactive ion etching (RIE) dry etching in an atmosphere of $BCL_3/CL_2$. Semiconductor material is etched until the n-GaN layer 11 is reached. The N-trench 4 may be about 1.5 microns deep.

Figure 9:
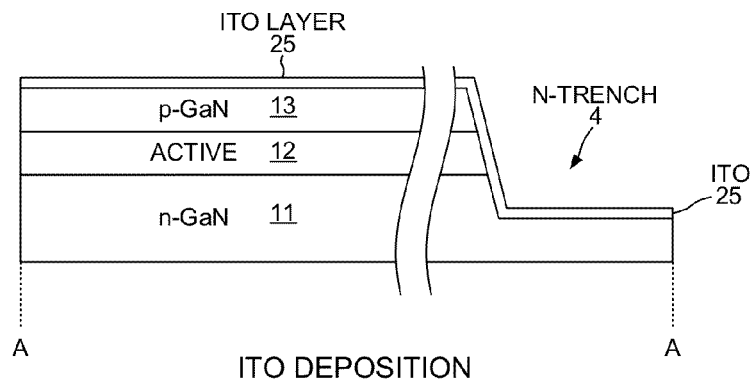
FIG. 9 is a diagram of a step of depositing a layer of ITO in the manufacture of the LED device of FIG. 1.

FIG. 9 is a diagram of a step of depositing a layer 25 of ITO. In one example, the ITO is a layer approximately 1000 angstroms thick that is deposited using electron beam (E-beam) physical vapor deposition.

Figure 10:
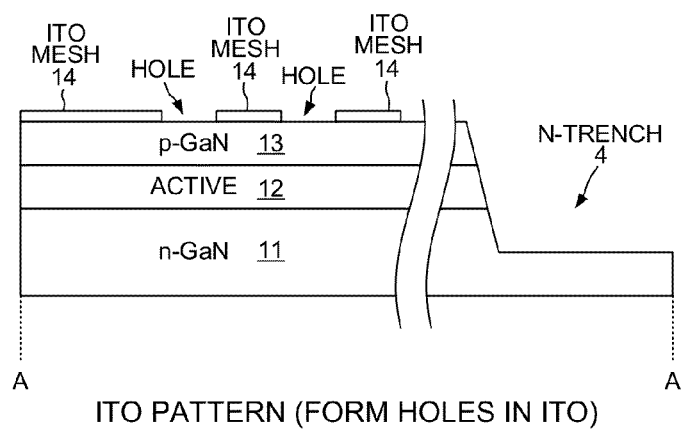
FIG. 10 is a diagram of a step of forming the ITO layer into an ITO mesh layer having holes.

FIG. 10 is a diagram that shows a step of patterning the ITO layer 25 of FIG. 9 to form the ITO mesh layer 14. In the illustrated example, all ITO is removed from the sidewall of the mesa, as well as from the bottom surface of the N-trench 4. Circular holes (see hole 18 in FIG. 3) are formed in the ITO layer 25 on the top surface of the mesa to form the ITO mesh layer 14. In one example, the mesh ITO layer 14 is formed by depositing and patterning a layer of photoresist, performing a TE-100 wet etch at 50° C. for four minutes, and then stripping away the photoresist mask using a standard photoresist strip solvent. The holes are patterned to be of different sizes as illustrated in FIG. 3. Each hole has a cross-sectional area that is less than 500 square microns and is more than 10 square microns. The holes may, for example, have diameters that range from about eight microns to about sixteen microns.

Figure 11:
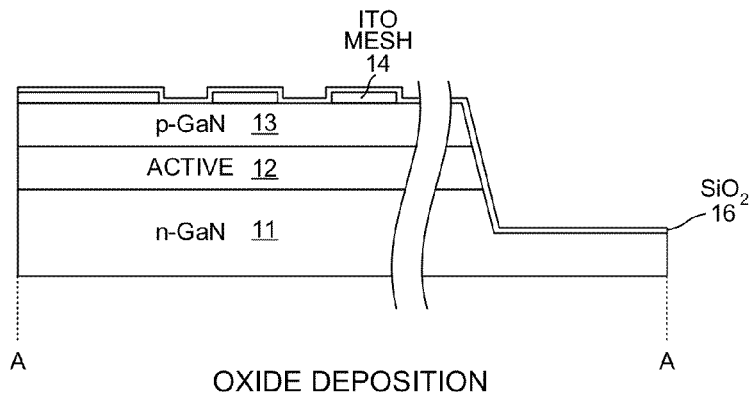
FIG. 11 is a diagram of a step of depositing a layer of silicon dioxide over the ITO mesh of FIG. 10.

FIG. 11 is a diagram of a subsequent step of depositing the silicon dioxide layer 16 over the entire device wafer including the mesh ITO layer 14. In one example, the silicon dioxide is E-beam deposited to a thickness of approximately 150 angstroms. In another example, the silicon dioxide is deposited using plasma enhanced chemical vapor deposition (PECVD).

Figure 12:
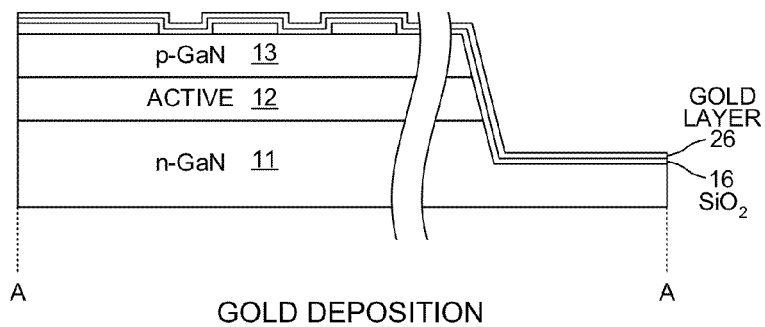
FIG. 12 is a diagram of a step of depositing a layer of gold over the silicon dioxide layer of FIG. 11.

FIG. 12 is a diagram of a subsequent step of depositing a gold layer 26 over the entire device wafer so that the gold layer 26 is disposed on the silicon dioxide layer 16. In one example, the gold is E-beam deposited to a thickness of approximately 100 angstroms. If the silicon dioxide of the prior step is E-beam deposited, then this next step of depositing gold layer 26 can be advantageously carried out in the same E-beam run.

Figure 13:
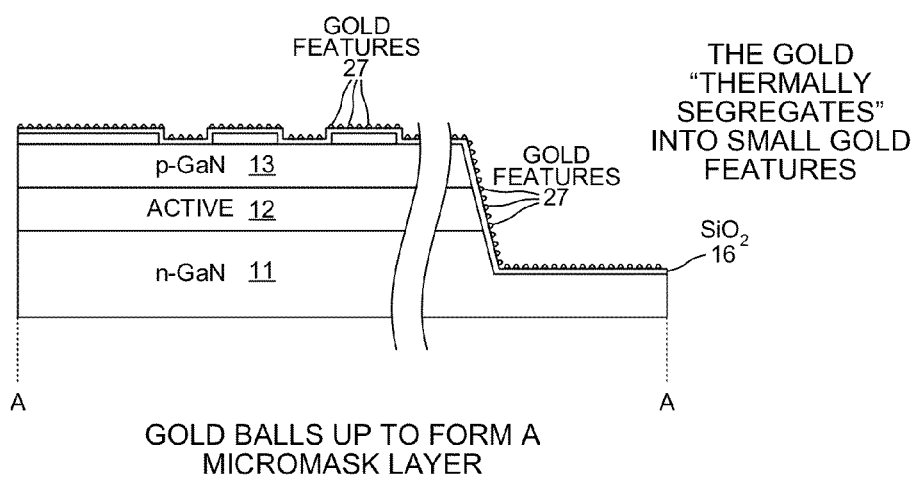
FIG. 13 is a diagram of a step of balling up gold from the gold layer of FIG. 12 to form small gold features.

FIG. 13 is a diagram of a subsequent step of causing the gold to thermally segregate and to ball up to form a plurality of small gold features. Reference numeral 27 identifies some of the gold features. The gold features a spread over the silicon dioxide surface in a substantially uniform way. In one example, each gold feature covers a corresponding area of a top surface of the silicon dioxide layer 26, where this corresponding area is less than one square micron. A gold feature when molten and then subsequently solidifying is held together by surface tension, so that each of the resulting gold features has a rounded smooth outer surface having the shape of a liquid gold micro-droplet on a surface. In one example, the gold layer is made to ball up into the plurality of gold features by subjecting the gold layer 26 of FIG. 12 to a temperature of 300° C. in $N_2$ gas for five minutes with no oxygen present. Rapid thermal annealing (RTA) equipment or a conventional furnace is used to perform this thermal treatment step. The resulting plurality of small gold features that is spread evenly across the upper surface of silicon dioxide layer 16 is referred to as a gold micromask.

Figure 14:
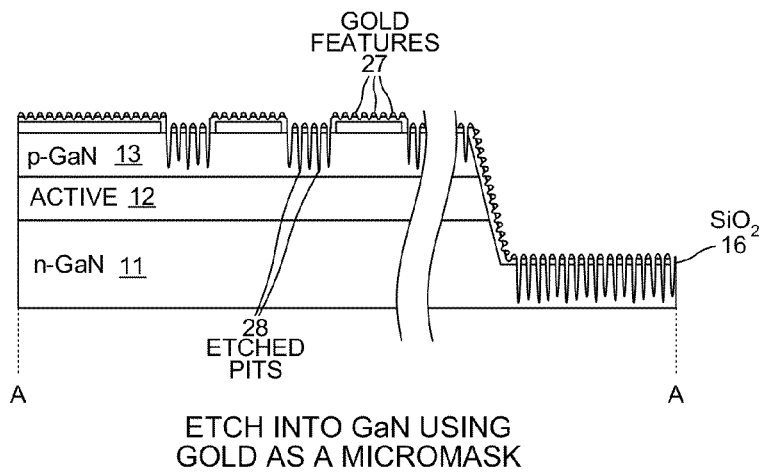
FIG. 14 is a diagram of a step of etching into the p-GaN layer using the gold micromask as a etching mask.

FIG. 14 is a diagram of a subsequent step of etching all the way through the silicon dioxide layer 16 and into the upper surface of the p-GaN layer 13 using the gold micromask as an etch mask. In one example, this etching is an ICP/RIE dry etch performed in an atmosphere of $BCl_3/Cl_2$. The pitch (average distance across the p-GaN surface per etched pit) of the resulting roughened p-GaN surface is approximately 0.4 microns. The resulting etched pits 28 are about 100 nanometers RMS in depth, or 150 nanometers peak-to-trough maximum as measured by an atomic force microscope (AFM). In areas covered by the gold micromask where ITO is disposed under the micromask, the etching etches through the silicon dioxide layer in areas not covered by the micromask, but the etching only etches a short distance into the underlying ITO layer.

Figure 15:
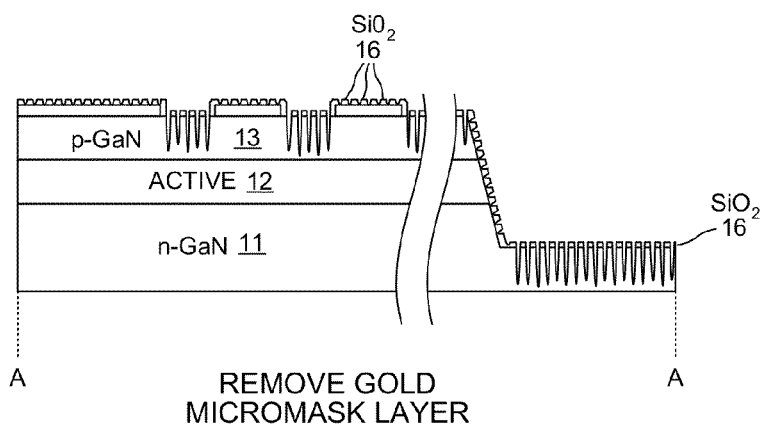
FIG. 15 is a diagram of a step of removing the gold micromask.

FIG. 15 is a diagram of a subsequent step of removing the gold micromask. Rather than using a harsh etchant of the type that would typically be required to remove silver, the etchant used in the process described here is a relatively gentle iodide-based etchant. In one example, the gentle etchant is gold etchant GE-8148 available from Transene Company Inc., 10 Electronics Ave., Danvers, Mass. 01923. Etching occurs for less than twenty seconds to remove substantially all gold from the surface of the device wafer.

Figure 16:
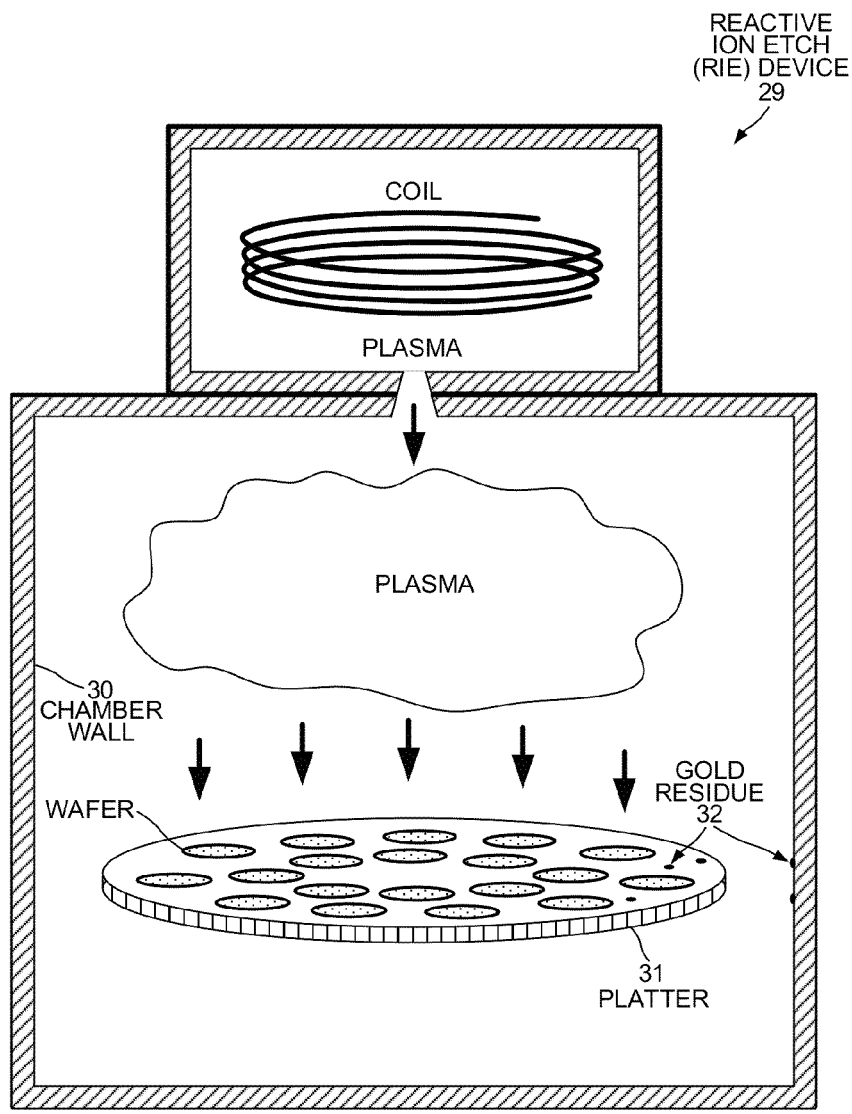
FIG. 16 is a diagram of a step of cleaning gold residue from the inside of an RIE chamber and from a device wafer.

FIG. 16 is a diagram of a step of cleaning gold residue from the inside wall of the Reactive Ion Etch (RIE) device 29 used to perform the etching of FIG. 15. RIE device 29 includes a chamber 30 and a platter 31 within the chamber. Reference numeral 32 identifies gold residue that remains on the chamber walls after the prior etching step. Reference numeral 32 also identified gold residue that remains on the platter after the prior etching step. This gold residue 32 is removed in the step of FIG. 16. In one example, gold residue 32 is removed in a two step process. The first step is a plasma cleaning step in a $SF_6/O_2$ atmosphere. This step cleans gold from the platter. The second step involves periodically cleaning the chamber walls by manually wiping the walls with a gentle solvent such as isopropyl alcohol.

In one alternative embodiment, a strip of the ITO layer 25 is left disposed at the bottom of the N-trench. This strip of ITO serves as an etching mask to prevent roughening of the n-GaN in the area of the N-trench directly under where the metal of the N-electrode will later be formed. If such a protective amount of ITO was used to prevent roughening in the N-trench, then that masking portion of the ITO layer in the N-trench is removed. Removal of the ITO strip in the N-trench involves depositing a layer of photoresist and patterning it so that it protects all of the device wafer but for the bottom of the N-trench. A TE-100 wet etch is then performed for fifteen minutes at 50° C. for remove the exposed ITO strip in the N-trench. A final etching is performed to remove the photoresist mask.

Figure 17:
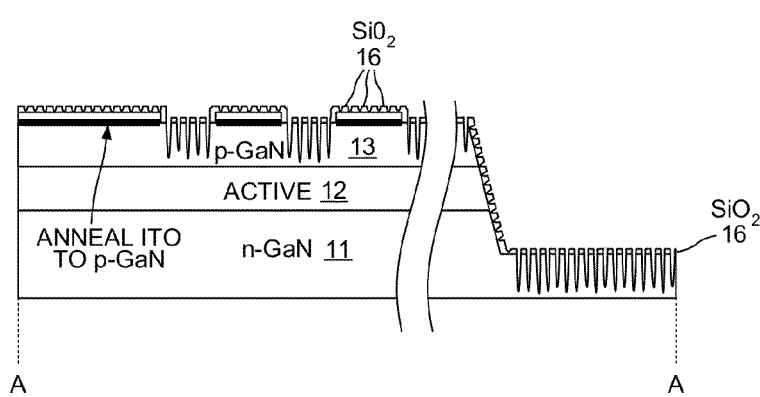
FIG. 17 is a diagram of a step of annealing the ITO-to-p-GaN contact of the LED structure.

FIG. 17 is a diagram of a subsequent step of annealing the ITO-to-p-GaN interface to make a good ohmic contact. In one example, the annealing involves a first anneal at 300° C. for five minutes in an air atmosphere (20% $O_2$, 80% $N_2$), and a second anneal at 550° C. for five minutes in a nitrogen atmosphere.

Figure 18:
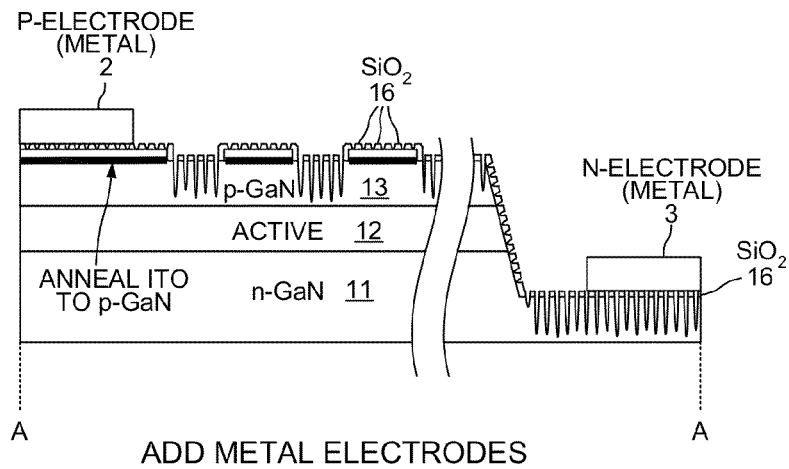
FIG. 18 is a diagram of a step of adding metal electrodes to the structure of FIG. 17.

FIG. 18 is a diagram of a subsequent step of adding the metal of electrodes 2 and 3. To form the electrodes, metal is deposited, and then patterned and selectively etched in conventional fashion.

Figure 19:
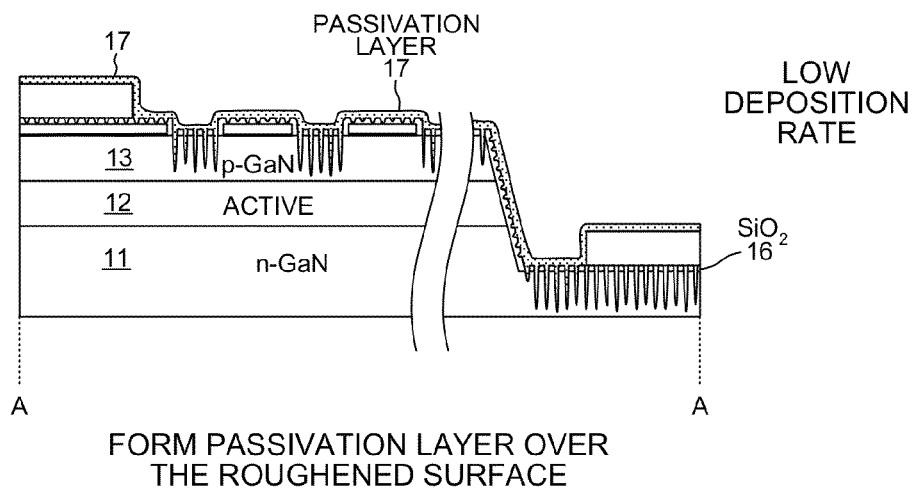
FIG. 19 is a diagram of a step of depositing a passivation layer over the LED device structure of FIG. 18.

FIG. 19 is a diagram of a subsequent step of adding passivation layer 17. As opposed to depositing the passivation at a high deposition rate and at low temperature (for example, at a pressure of 600 mT and a rate of 157 angstroms per minute), the passivation layer 17 is deposited at a low deposition rate and at a high temperature (for example, at a pressure of 1000 mT and a rate of 33 angstroms per minute). Depositing the passivation layer 17 in this way results in better conformal covering of the roughened p-GaN surface than would depositing passivation layer 17 in a standard fashion.

Figure 20:
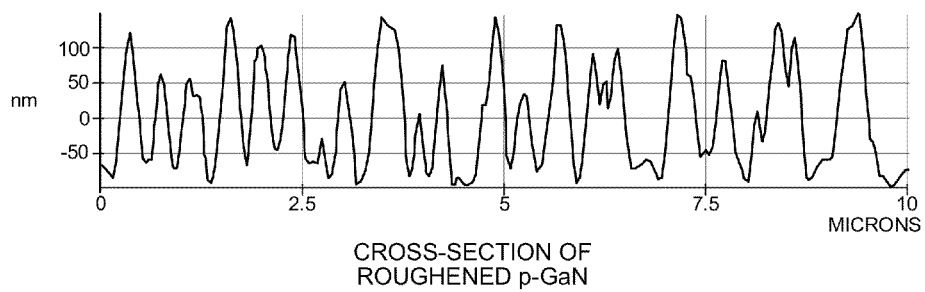
FIG. 20 is a diagram that shows the contour of the roughened p-GaN surface.

FIG. 20 is a diagram showing the measured topology across a portion of the roughened p-GaN surface. The data was taken using an atomic force microscope (AFM).

Figure 21:
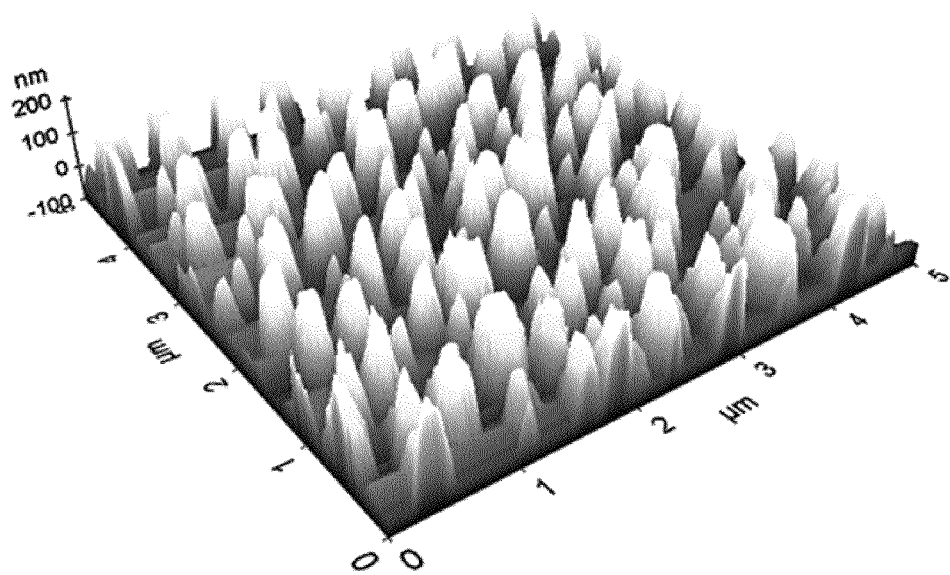
FIG. 21 is a three-dimensional perspective view of the roughened p-GaN surface.

FIG. 21 is a three-dimensional diagram of the roughened p-GaN surface.

FIG. 22 is a table that sets forth steps in a method of forming the LED device 1 of FIG. 1. For each step identified in the left column, associated process conditions and particulars are set forth in the corresponding row in the center column.

In a prior art method, a layer of silver is deposited on another layer and is then thermally segregated to form a micromask of silver. The micromask is then used as a mask in an etching step to roughen a semiconductor surface. Silver has several undesirable qualities, one of which is a tendency to electromigrate. Another is that it can be difficult to remove silver residue thoroughly without damaging an LED being cleaned. Accordingly, were the silver micromask to be used commercially in the manufacture of LED devices, a harsh solvent such a sulfuric acid would likely have to be used to remove silver from the device wafer. If silver residue were not thoroughly removed, then some LED devices may be made in an experimental low volume operation, but low manufacturing yields and other problems may result were the silver process to be used in a commercial high volume setting. Moreover, silver chloride would likely be produced as a consequence of removal of the silver micromask. Care would also have to be taken to remove any such silver chloride that would be deposited as a residue on the inside of the RIE chamber. In one advantageous aspect, the method set forth above in connection with FIGS. 8-19 does not involve a silver micromask and therefore does not involve silver contamination and cleaning problems. Gold does not exhibit the electromigration problems that silver does. Moreover, gold can be cleaned relatively easily and without having to resort to harsh solvents as compared to silver. Furthermore, the RIE chamber and device wafer do not have to be cleaned as thoroughly of gold because gold does not adversely affect LED manufacture in the way that silver does.

Figure 23:
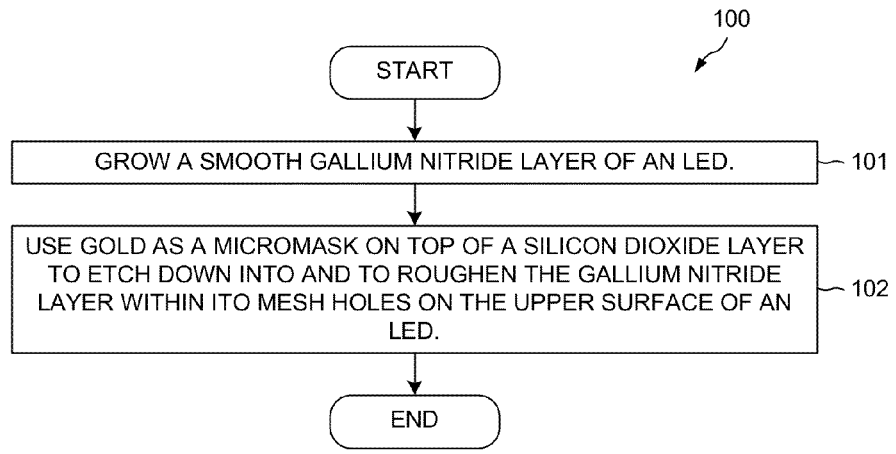
FIG. 23 is a flowchart of a method in accordance with a first novel aspect.

FIG. 23 is a flowchart of a method 100 in accordance with a first novel aspect. In a first step (step 101), a layer of gallium nitride is grown to have a smooth upper surface. In one example, this gallium nitride layer is a p-GaN layer on the top of a LED device, where the epitaxial layers of the LED are formed on a smooth and relatively less expensive sapphire wafer. In a second step (step 102), gold is used as a micromask to etch down into and to roughen the gallium nitride layer in areas not covered by an ITO mesh layer, thereby roughening the gallium nitride layer in areas not covered by the ITO mesh. In one example, a layer of ITO is formed over the smooth upper surface of the gallium nitride layer, and holes are formed into the ITO layer, thereby fashioning the ITO layer into an ITO mesh layer having holes. A layer of silicon dioxide is then deposited. This silicon dioxide covers the surface of the gallium nitride at the bottoms of the holes of the ITO mesh. A layer of gold is then deposited on the silicon dioxide layer, and the gold is thermally treated so that the gold forms a plurality of substantially uniformly sized and spaced gold features. These gold features, as they are disposed on the silicon dioxide layer at the bottoms of the holes of the ITO mesh, are then used as a micromask in a subsequent etching step. Areas of the silicon dioxide that are not protected by gold features are etched away. At the bottom of the holes in the ITO mesh, etching continues down into the surface of the gallium nitride, thereby roughening the gallium nitride layer in areas at the bottoms of the holes. In one advantageous aspect, the micromask does not involve silver. In another advantageous aspect, harsh cleaning agents such as sulfuric acid are not used in cleaning metal residue from the device wafer when the micromask is removed.

In one prior art method, the p-GaN layer is grown to have a rough upper surface. Thus, no micromask is required to roughen the upper surface of the gallium nitride in the prior art method. Growing roughened gallium nitride, however, has various disadvantages over roughening the smooth upper surface of gallium nitride as performed in method 100. First, when growing roughened gallium nitride, it is more difficult to control the depth of the pits. If the depth is too shallow, the light output efficiency achieved by scattering will be diminished. If the depth of the pits is too deep, the bottom of the pits approaches the active layer and can lead to shorting. Even if the LED device does not short out when tested, overly deep pits can pose an electrostatic discharge (ESD) problem for the resulting LED device during an ESD event. The depth of the pits can easily be controlled in method 100 by adjusting the etching time.

Second, where the gallium nitride is grown with a roughened upper surface, the ITO that is deposited over the roughened surface forms a worse electrical connection to the gallium nitride layer. In the method 100, ITO is deposited over a smooth upper surface of gallium nitride and acts as a mask to prevent the surface of gallium nitride under the ITO from being roughened. In addition, in an embodiment of method 100, ITO patches are used as a mask and prevent the upper surface of gallium nitride from being roughened in the areas beneath the N-electrodes. Method 100 enables a good electrical connection to be formed between the p-GaN layer 13 and the ITO mesh 14 and allows the LED device to have a lower forward voltage ($V_f$).

Figure 24:
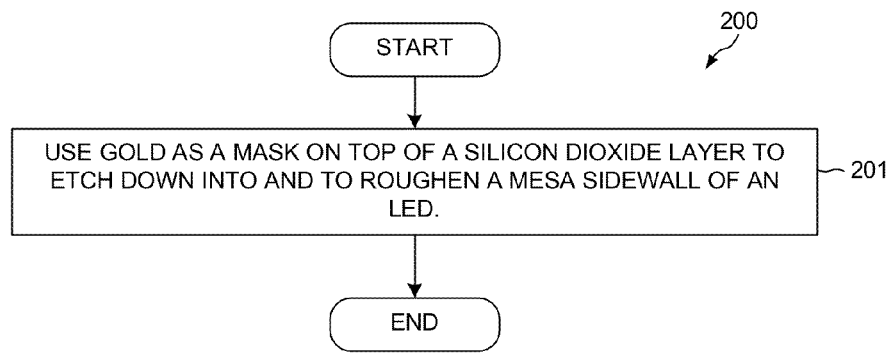
FIG. 24 is a flowchart of a method in accordance with a second novel aspect.

FIG. 24 is a flowchart of a method 200 in accordance with a second novel aspect. Gold is used (step 201) as a micromask on top of a silicon dioxide layer to etch down into and to roughen a mesa sidewall of an LED. The method 200 of FIG. 24 is similar to the method 100 of FIG. 23, except that the surface being roughened is a sidewall of a mesa in an LED.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:
1. A method comprising:
using a micromask of gold to etch down into and to roughen a surface of a gallium nitride layer, wherein an indium tin oxide (ITO) is disposed over the gallium nitride layer and patterned so as to form a mesh layer of the indium tin oxide (ITO) having a hole herein, wherein a silicon dioxide layer is disposed over the surface of the gallium nitride layer at a bottom of the hole and disposed on the indium tin oxide (ITO) layer, wherein the micromask of gold is disposed on the silicon dioxide layer at the bottom of the hole and disposed on the silicon dioxide layer on the indium tin oxide (ITO) layer, and wherein the micromask of gold is used to etch through the silicon dioxide layer into the surface of the gallium nitride layer, wherein the micromask of gold is also used to etch down into the silicon dioxide layer on the indium tin oxide (ITO) layer and form a plurality of holes in the silicon dioxide layer so as to expose a surface of the indium tin oxide (ITO) layer in the plurality of holes in the silicon dioxide layer;
removing the micromask of gold from the silicon dioxide layer after using the micromask of gold to etch down into and to roughen the surface of the gallium nitride layer; and
forming a metal electrode having electrical contact with the indium tin oxide (ITO) layer through the surface of the indium tin oxide (ITO) layer exposed in the plurality of holes in the silicon dioxide layer.

2. The method of claim 1, wherein the micromask of gold includes a plurality of gold features disposed on the silicon dioxide layer, wherein each of the gold features covers a corresponding area of a top surface of the silicon dioxide layer, and wherein each corresponding area is an area of less than one square micron.

3. The method of claim 2, wherein each corresponding area is defined by a rounded perimeter.

4. The method of claim 2, wherein each gold feature is a rounded smooth feature.

5. The method of claim 2, wherein each gold feature is a thermally-segregated gold feature.

6. The method of claim 1, wherein the gold micromask is removed from the silicon dioxide layer without using sulfuric acid.

7. The method of claim 1, wherein the micromask of gold is removed from the silicon dioxide layer using an iodide-based etchant.

8. The method of claim 1, wherein each of the holes has cross-sectional area that is less than 500 square microns and more than 10 square microns.

9. The method of claim 1, wherein the micromask of gold is also used to etch down into and to roughen a mesa sidewall.

10. A method comprising:
forming a layer of indium tin oxide (ITO) over a layer of a semiconductor material;
forming a hole in the layer of indium tin oxide (ITO), the hole exposing the layer of the semiconductor material;
forming a layer of an insulating material over the layer of indium tin oxide (ITO) and at the bottom of the hole of the layer of indium tin oxide (ITO);
forming a layer of gold over the layer of insulating material on the layer of indium tin oxide (ITO) and over the layer of insulating material at the bottom of the hole;
causing the layer of gold to thermally segregate into a plurality of gold features;
etching through the layer of the insulating material into the layer of the semiconductor material and etching down into the layer of the insulating material on the layer of indium tin oxide (ITO) so as to form a plurality of holes in the layer of the insulating material and expose a surface of the layer of indium tin oxide (ITO) in the plurality of holes, using the plurality of gold features as a micromask;
removing the plurality of gold features from the layer of the insulating material after using the plurality of gold features to etch through the layer of the insulating material and into the layer of the semiconductor material; and
forming a metal electrode having electrical contact with the indium tin oxide (ITO) layer through the surface of the indium tin oxide (ITO) layer exposed in the plurality of holes in the layer of the insulating material.

11. The method of claim 10, wherein the insulating material is silicon dioxide, and wherein the layer of gold is less than 200 angstroms thick.

12. The method of claim 10, wherein the plurality of gold features are removed without using sulfuric acid.

13. The method of claim 10, further comprising: using an iodide-based etchant to remove the gold features.

14. The method of claim 10, wherein each of the plurality of gold features covers a corresponding area of a top surface of the layer of the insulating material, and wherein each corresponding area is an area less than one square micron.

15. The method of claim 1, wherein
the gallium nitride layer is a p-type gallium nitride layer,
an active layer is formed below the p-type gallium nitride layer,
an n-type gallium nitride layer is formed below the active layer, the silicon dioxide layer also disposed on the n-type gallium nitride layer, the micromask of gold also disposed on the silicon dioxide layer on the n-type gallium nitride layer, and
the micromask of gold is also used to etch down into and to roughen a surface of the n-type gallium nitride layer.

16. The method of claim 1, wherein
the gallium nitride layer is a p-type gallium nitride layer,
an active layer is formed below the p-type gallium nitride layer,
an n-type gallium nitride layer is formed below the active layer,
an n-side indium tin oxide (ITO) layer is disposed over a surface of the n-type gallium nitride layer, the silicon dioxide layer also disposed on the n-side indium tin oxide (ITO) layer, the micromask of gold also disposed on the silicon dioxide layer on the n-side indium tin oxide (ITO) layer, and
the micromask of gold is also used to etch down into the silicon dioxide layer on the n-side indium tin oxide (ITO) layer and expose a surface of the n-side indium tin oxide (ITO) layer.

17. The method of claim 10, wherein the layer of the insulating material is also formed on a sidewall of the layer of the semiconductor material, and the plurality of gold features are also used to etch down into and to roughen the layer of the insulating material formed on the sidewall of the layer of the semiconductor material.

18. The method of claim 10, wherein
the semiconductor material is a p-type semiconductor material,
an active layer is formed below the layer of the p-type semiconductor material,
a layer of an n-type semiconductor material is formed below the active layer, the layer of the insulating material also disposed on the layer of the n-type semiconductor material, the plurality of gold features also disposed on the layer of the insulating material on the layer of the n-type semiconductor material, and
the plurality of gold features are also used to etch down into and to roughen a surface of the layer of the n-type semiconductor material.

19. The method of claim 10, wherein
the semiconductor material is a p-type semiconductor material,
an active layer formed below the layer of the p-type semiconductor material,
a layer of an n-type semiconductor material is formed below the active layer,
an n-side indium tin oxide (ITO) layer is disposed over a surface of the layer of the n-type semiconductor material, the layer of the insulating material also disposed on the n-side indium tin oxide (ITO) layer, the micromask of gold also disposed on the layer of the insulating material on the n-side indium tin oxide (ITO) layer, and
the plurality of gold features are also used to etch down into the layer of the insulating material on the n-side indium tin oxide (ITO) layer and expose a surface of the n-side indium tin oxide (ITO) layer.

* * * * *